United States Patent [19]

Sommer et al.

[11] 4,308,508
[45] Dec. 29, 1981

[54] PHASE LOCKED LOOP FREQUENCY MODULATOR

[75] Inventors: Bernd Sommer, Lochham; Peter Baier, Gilching; Karl Knapp, Munich, all of Fed. Rep. of Germany

[73] Assignee: Siemens Aktiengesellschaft, Berlin & Munich, Fed. Rep. of Germany

[21] Appl. No.: 127,123

[22] Filed: Mar. 4, 1980

[30] Foreign Application Priority Data

Apr. 11, 1979 [DE] Fed. Rep. of Germany ....... 2914814

[51] Int. Cl.³ .......................... H03C 3/09; H03L 7/18
[52] U.S. Cl. ...................................... 332/18; 331/23; 332/19; 455/76; 455/112; 455/113
[58] Field of Search ................. 332/16 R, 18, 19, 22, 332/30 V; 331/23; 455/63, 76, 110, 112, 113, 119

[56] References Cited

U.S. PATENT DOCUMENTS 3,587,003 6/1971 Chastagnier ................... 331/23 X
3,805,192 4/1974 Ocnaschek et al. ............... 331/25

FOREIGN PATENT DOCUMENTS 1371914 10/1974 United Kingdom ................ 332/19

*Primary Examiner*—Siegfried H. Grimm
*Attorney, Agent, or Firm*—Hill, Van Santen, Steadman, Chiara & Simpson

[57] ABSTRACT

A frequency modulator including a free-running oscillator which is frequency modulated and which is frequency stabilized by means of a reference oscillation by way of a phase control loop having a phase detector and a loop filter. In order to be able to process d.c. components with such a frequency modulator, given a keyed modulation signal, and without abandoning the limitation of the modulation spectrum, the modulation signal is supplied to a control input of the oscillator both by way of a modulation filter and by way of the phase control loop. For this purpose, the phase control loop includes, between the oscillator output and the phase detector, a frequency divider having a division ratio controlled by the modulation signal.

4 Claims, 3 Drawing Figures

PHASE LOCKED LOOP FREQUENCY MODULATOR

BACKGROUND OF THE INVENTION

1. Field of the Invention

The present invention relates to a frequency modulator comprising a self-oscillating oscillator which is modulatable in its frequency and which is stabilized with respect to its output frequency by means of a reference oscillation by way of a phase control loop having a phase indicator and a loop filter.

2. Description of the Prior Art

Frequency modulators of the type generally set forth above are known, for example from the German Pat. No. 2,055,998 (or equivalent British Pat. No. 1,371,914). The output frequency of the self-oscillating or free-running oscillator can be stabilized in the desired manner by means of a phase control loop, in conjunction with a highly-stable reference oscillation as is supplied, for example, by a crystal oscillator. The phase control loop is designed in such a manner that it cannot follow the frequency change of the modulation signal, i.e., the modulation of the free-running oscillator is thereby not prejudiced.

Such a frequency modulator is not suited for a keyed modulation as is undertaken, for example, in the transmission of telegraphic characters and teleprinter characters by way of short-wave transmitters. In such a keyed modulation application, in particular d.c. components must be transmitted when no change of state of the signal occurs over longer times. The transmission of such d.c. components, however, is in opposition to the phase control loop since, of course, it must exhibit a finite control velocity which becomes effective here and therefore levels such d.c. components.

SUMMARY OF THE INVENTION

The object of the present invention is to provide a frequency modulator of the type generally mentioned above which also permits processing of d.c. components and which is therefore likewise suited for the implementation of a keyed frequency modulation.

The above object is achieved, according to the present invention, in that, for the implementation of a frequency modulation, the modulation signal is supplied to the control input of the oscillator both directly by way of a modulation filter determining the limitation of the modulation spectrum and indirectly by way of a phase control loop, in particular, by means of a frequency divider which is controllable with respect to its division ratio and which is arranged between the oscillator and the phase indicator.

The present invention is based on the idea that the processing of d.c. components is fundamentally possible in a free-running oscillator which operates with a phase control loop in that the modulation signal indirectly influences the control, i.e., by means of a frequency divider which is controllable with respect to its division ratio and located in the connection path between the output of the free-running oscillator and a phase indicator of a phase control loop. This, however, results in the fact that the loop filter must now be designed with respect to its limiting frequency in such a manner that the control of the rate of increase of the modulation signal can follow. This means that the broad-band characteristic of the modulation spectrum is hardly limited given such a circuit. This is generally not acceptable because, in practical applications, for example, in short-wave transmitters, the signal transmission occurs in frequency division multiplex and the individual signal channels are arranged in a narrow frequency grid for reasons of frequency economy. Therefore, the modulation spectra of the individual signal channels must be limited in order to avoid a mutual disruption of the channels.

According to the two-fold control of the free-running oscillator of the present invention, it is achieved in an extraordinarily advantageous manner that, in addition to a high stability of the output frequency and processing of d.c. components, a sufficient limitation of the modulation spectrum at both sides of the oscillator carrier frequency is achieved. Since the band width of the loop filter can be dimensioned in such a manner that the control loop is not able to follow the change of the modulation signal in the center, the band limitation of the modulation spectrum can be exclusively determined by the modulation filter by way of which the modulation signal is indirectly supplied to the free-running oscillator. The direct control of the self-oscillating oscillator by way of the control loop is limited, in turn, to such signal components of the modulation signal which exhibit no state change over long time durations, since only the control loop responds to such situations.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
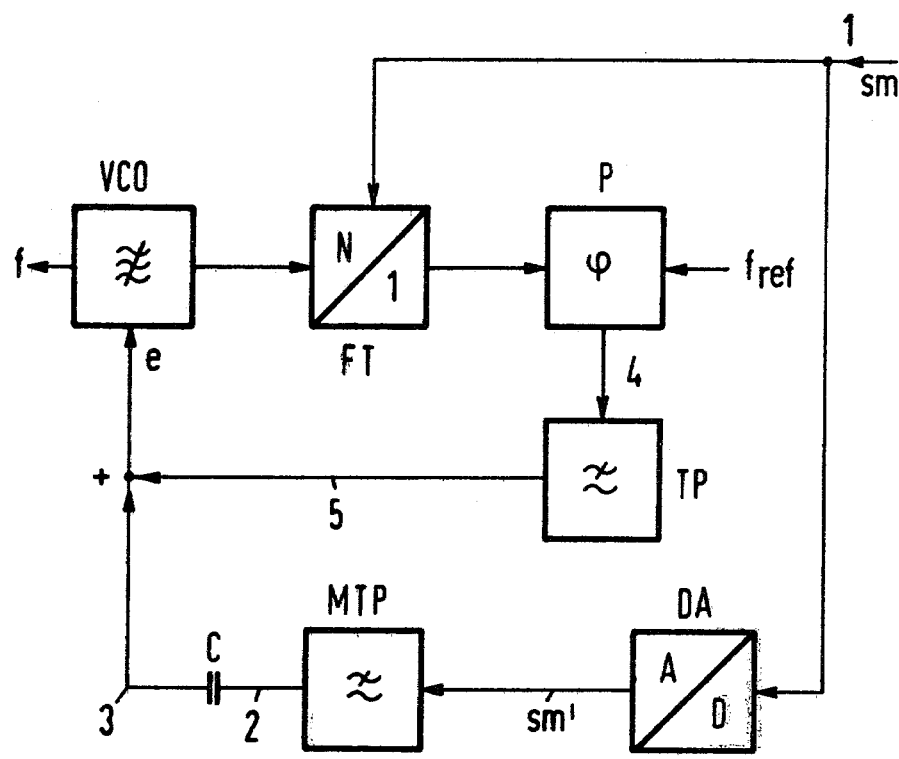
FIG. 1 is a block circuit diagram of a frequency modulator constructed in accordance with the present invention.

Referring to FIG. 1, a free-running oscillator VCO is controllable with respect to its frequency f by way of a control input e. Proceeding from the output of the oscillator VCO, a control loop is provided which comprises a frequency divider FT, a phase indicator P and a low pass filter TP. The reference oscillation having the frequency $f_{ref}$ is supplied to a second input of the phase indicator P, the reference oscillation being generated, for example, by a crystal oscillator and being large in comparison to the basic frequency of the modulation signal $s_m$. The digital modulation signal $s_m$ indirectly controls the frequency divider FT and, moreover, is supplied to a modulation filter MTP as an analogue modulation signal $s_m'$ by way of a digital/analogue converter DA. In addition to the output signal of the low pass filter TP, the analogue modulation signal $s_m'$ at the output of the modulation low pass filter MTP, freed of d.c. components by way of a capacitor C, becomes effective at the control input e of the oscillator VCO.

Figure 2:
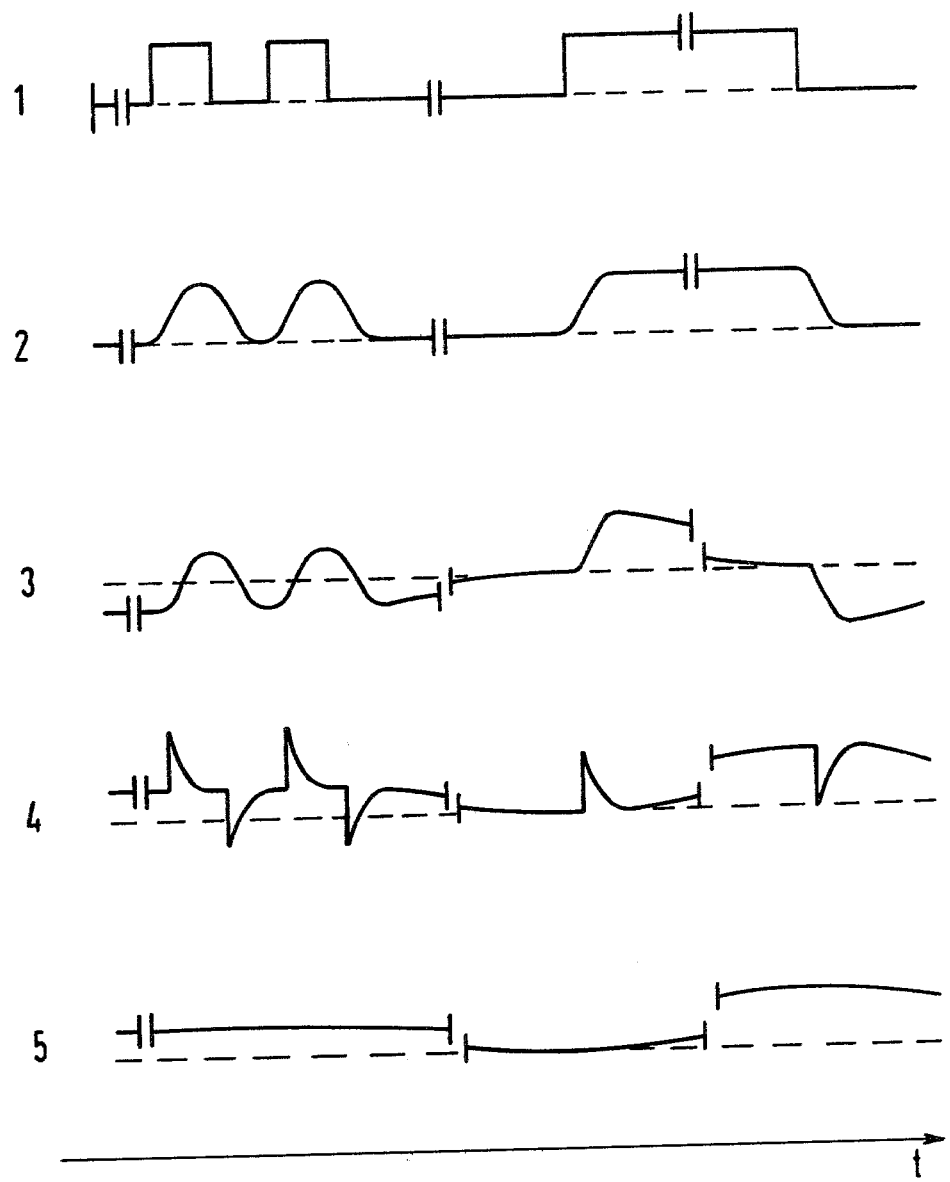
FIG. 2 is a graphic illustration of time diagrams detailing the operation of the frequency modulator of FIG. 1.

The timing diagrams of FIG. 2 indicate the voltage wave forms at correspondingly designated locations in FIG. 1 with the references 1–5 over a time interval t.

Diagram 1 illustrates the digital modulation signal $s_m$ in the form of a rectangular pulse sequence with temporally fluctuating duration of the pulses and of the pulse intervals. At each change in the cycle of the digital modulation signal, the frequency divider FT is transferred in respect of its division ratio. The result at the output of the phase descriminator P is illustrated in diagram 4. This signal is smoothed by way of the low pass filter TP so that only the change of the d.c. component can become effective at the control input e of the oscillator VCO, as is illustrated in diagram 5. The analogue modulation signal $s_m'$ at the output of the modulation low pass filter MTP, being limited with respect to its modulation spectrum, is shown in diagram 2 and the signal freed of its d.c. component behind the capacitor C is indicated in diagram 3. The vertical lines indicate that the signal components illustrated in FIG. 2 have been illustrated in abbreviated form without a state change. The voltages according to diagrams 3 and 5 are added to the control signal at the control input e by way of a summing circuit point +.

Figure 3:
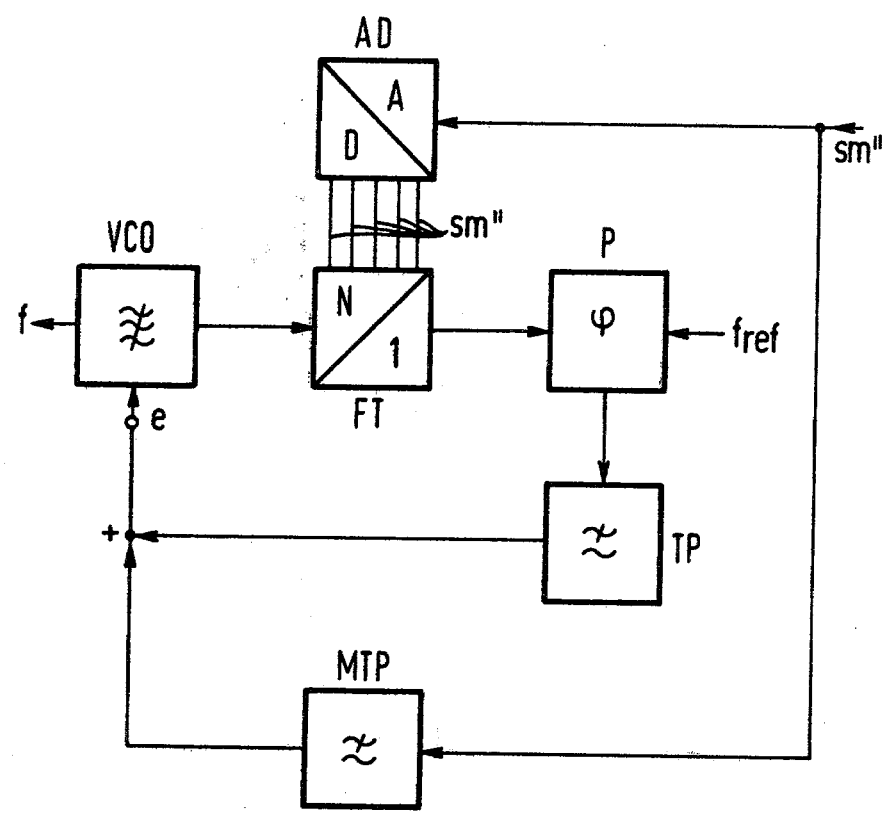
FIG. 3 is a block circuit diagram of another embodiment of a frequency modulator constructed in accordance with the present invention.

Another embodiment of the invention is illustrated in FIG. 3 and is suitable for the control of an oscillator VCO with an analogue modulation signal $s_m''$. The circuit of FIG. 3 differs from the circuit of FIG. 1 in that the analogue modulation signal is directly supplied to the modulation low pass filter MTP and is supplied in bit-parallel form to the control input or, respectively, the parallel control inputs of a frequency divider FT by way of an analogue/digital converter AD as a digital modulation signal $s_m'''$.

If the modulation signal has a periodic structure, then it is advantageous for the smooth operation of a frequency modulator according to the present invention when the basic frequency of the periodic modulation signal is different from the n/k-fold multiple of the frequency $f_{ref}$ of the reference oscillation, where n and k are whole numbers. By doing so, wow of very low frequencies which could have feedback on the control loop is avoided.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a frequency modulator of the type in which a variable oscillator having a control input is stabilized by a reference frequency in a phase control loop which includes a phase detector and a loop filter, the improvement therein comprising:
    a modulation filter connected to receive a modulation signal;
    a frequency divider connected in the phase control loop between the oscillator and the phase detector, said frequency divider connected to receive and change its division ratio in response to the modulation signal; and
    summing means connected between the outputs of said modulation and loop filters and the control input.

2. The improved frequency modulator of claim 1, comprising:
    a digital/analogue converter connected ahead of said modulation filter to receive a digital modulation signal and convert the same into an analogue signal.

3. The improved frequency modulator of claim 1, comprising:
    an analogue digital converter connected ahead of said frequency divider to receive an analogue modulation signal and provide a digital signal for changing the division ratio.

4. The improved frequency modulator of claim 1, wherein:
    the frequency of the basic oscillation of the periodically formed modulation signal is different from the n/k-fold multiple of the reference frequency, where n and k are whole numbers.

* * * * *